(12) United States Patent
Li et al.

(10) Patent No.: US 7,447,093 B2
(45) Date of Patent: *Nov. 4, 2008

(54) METHOD FOR CONTROLLING VOLTAGE IN NON-VOLATILE MEMORY SYSTEMS

(75) Inventors: Jun Li, Palo Alto, CA (US); Prajit Nandi, Karnataka (IN); Mehrdad Mofidi, Fremont, CA (US)

(73) Assignee: SanDisk Corporation, Milpitas, CA (US)

( * ) Notice: Subject to any disclaimer, the term of this patent is extended or adjusted under 35 U.S.C. 154(b) by 75 days.

This patent is subject to a terminal disclaimer.

(21) Appl. No.: 11/618,541

(22) Filed: Dec. 29, 2006

(65) Prior Publication Data

US 2008/0159000 A1    Jul. 3, 2008

(51) Int. Cl.
G11C 7/04 (2006.01)
G11C 5/14 (2006.01)
G11C 11/34 (2006.01)

(52) U.S. Cl. ............... 365/212; 365/211; 365/185.23; 365/189.09; 365/189.11

(58) Field of Classification Search ........... 365/211, 365/212, 189.09, 185.23
See application file for complete search history.

(56) References Cited

U.S. PATENT DOCUMENTS

| | | | |
|---|---|---|---|
| 5,864,504 A | 1/1999 | Tanzawa et al. | |
| 6,026,023 A | 2/2000 | Tonda | |
| 6,205,074 B1 * | 3/2001 | Van Buskirk et al. | ....... 365/211 |
| 6,314,026 B1 | 11/2001 | Satoh et al. | |
| 6,452,437 B1 | 9/2002 | Takeuchi et al. | |
| 6,560,152 B1 | 5/2003 | Cernea | |
| 6,667,904 B2 * | 12/2003 | Takeuchi et al. | ....... 365/185.03 |
| 6,801,454 B2 * | 10/2004 | Wang et al. | ............ 365/185.18 |
| 6,807,111 B2 | 10/2004 | Marotta et al. | |
| 6,859,395 B2 | 2/2005 | Matsunaga et al. | |
| 6,870,766 B2 | 3/2005 | Cho et al. | |
| 7,054,195 B2 | 5/2006 | Matsunaga | |
| 7,057,958 B2 * | 6/2006 | So et al. | ................ 365/211 |
| 7,180,211 B2 * | 2/2007 | Sinha et al. | ............ 307/651 |
| 7,184,313 B2 | 2/2007 | Betser et al. | |

(Continued)

FOREIGN PATENT DOCUMENTS

EP    1253597    10/2002

OTHER PUBLICATIONS

Notice of Allowance dated Jun. 16, 2008 in U.S. App. No. 11/499,067.

*Primary Examiner*—Huan Hoang
*Assistant Examiner*—Michael J Weinberg
(74) *Attorney, Agent, or Firm*—Vierra Magen Marcus & DeNiro LLP

(57) ABSTRACT

Method for controlling voltage in a non-volatile memory system is provided. The method includes selecting a first input value for a voltage generator system operating in one of a plurality of modes, the first input value controlling a temperature dependent component of a voltage applied to a memory cell; and selecting a second input value for the voltage generator system operating in one of the plurality of modes, the second input value controlling a temperature independent component of the voltage applied to the memory cell. The temperature dependent component of the voltage applied to the memory cell and the temperature independent component of the voltage applied to the memory cell are controlled independently in response to the first input value and the second input value.

8 Claims, 6 Drawing Sheets

U.S. PATENT DOCUMENTS

| | | | |
|---|---|---|---|
| 7,266,031 B2 * | 9/2007 | Kim et al. | 365/211 |
| 7,313,044 B2 * | 12/2007 | Fuhrmann et al. | 365/211 |
| 7,342,831 B2 | 3/2008 | Mokhlesi et al. | |
| 2006/0133143 A1 | 6/2006 | Hosono | |
| 2007/0291566 A1 | 12/2007 | Mokhlesi et al. | |
| 2007/0291567 A1 | 12/2007 | Mokhlesi et al. | |
| 2008/0031066 A1 * | 2/2008 | Nandi | 365/211 |

* cited by examiner

METHOD FOR CONTROLLING VOLTAGE IN NON-VOLATILE MEMORY SYSTEMS

CROSS-REFERENCE TO RELATED APPLICATIONS

This patent application is related to U.S. patent application Ser. No. 11/499,067, entitled "METHOD AND SYSTEM FOR INDEPENDENT CONTROL OF VOLTAGE AND ITS TEMPERATURE COEFFICIENT IN NON-VOLATILE MEMORY DEVICES", filed on Aug. 4, 2006, the disclosure of which is incorporated herein by reference in its entirety.

BACKGROUND

1. Field of the Invention

The present invention relates generally to non-volatile memory systems and particularly, to controlling voltage in non-volatile memory systems.

2. Background of the Invention

Non-volatile semiconductor memory systems (or devices) have become popular for use in various electronic devices. For example, non-volatile semiconductor memory, such as Electrical Erasable Programmable Read Only Memory (EEPROM) and flash memory, is used in cellular telephones, digital cameras, personal digital assistants, mobile computing devices and other electronic devices.

Typically, flash memory systems include an array of memory cells, which are selected by word lines extending along rows of the memory cells, and bit lines extending along columns of the memory cells. One example of a flash memory system uses a NAND structure, which includes arranging multiple transistors in series, sandwiched between two select gates.

In general, plural voltages are applied to memory cells for different operational modes; such as a read mode or program verify mode jointly referred to herein as read and program verify mode), a select gate drain mode and others. It is desirable, to independently control a temperature dependent component and a temperature independent component of the applied voltages, using the same voltage generator system configured to operate in plural operational modes. Conventional systems may use plural voltage generator systems to control the temperate dependent and temperature independent components of applied voltages for plural operational modes.

Therefore, there is a need for a system that can operate in plural operational modes and independently control the temperature dependent component and the temperature independent component of applied voltages.

SUMMARY OF THE INVENTION

The present invention provides a system and associated method for independently controlling the temperature independent and temperature dependent components of voltages applied to a non-volatile memory system operating in plural operational modes.

In one embodiment, a method for controlling voltage in a non-volatile memory system is provided. The method includes selecting a first input value for a voltage generator system operating in one of a plurality of modes, the first input value controlling a temperature dependent component of a voltage applied to a memory cell; and selecting a second input value for the voltage generator system operating in one of the plurality of modes, the second input value controlling a temperature independent component of the voltage applied to the memory cell. The temperature dependent component of the voltage applied to the memory cell and the temperature independent component of the voltage applied to the memory cell are controlled independently in response to the first input value and the second input value.

This brief summary has been provided so that the nature of the invention may be understood quickly. A more complete understanding of the invention can be obtained by reference to the following detailed description of the preferred embodiments thereof in connection with the attached drawings.

BRIEF DESCRIPTION OF THE DRAWINGS

The foregoing and other features of several embodiments are now described with reference to the drawings. In the drawings, the same components have the same reference numerals. The illustrated embodiments are intended to illustrate, but not to limit the invention. The drawings include the following Figures.

DETAILED DESCRIPTION

Definitions:

The following definitions are provided, as they are typically (but not exclusively) used in relation to non-volatile memory systems (for example, flash memory systems or flash memory devices used hereinafter interchangeably) and referred to herein in descriptions of various embodiments of the present invention:

"Temperature coefficient" or "$T_{CO}$" is a multiplication factor operating on a temperature dependent variable for controlling a temperature dependent component (value) of a voltage.

"$V_{CGRV}$" is a voltage to read (or read and program verify, used interchangeably herein) a memory cell state, applied to a gate of a non-volatile memory cell in excess of a threshold voltage.

"$V_{SGD}$" is a voltage applied to a select gate drain node during a boosting phase of a programming cycle of a memory cell.

In one aspect of the present invention, a system is provided for independently controlling a temperature dependent component (via $T_{CO}$) and a temperature independent component of an applied voltage, for plural operating modes of a non-volatile memory system. In one embodiment, the system may include a time multiplexing or an equivalent, which may be used to select input values in response to an operating mode of the non-volatile memory system, as described below.

To facilitate an understanding of the adaptive aspects of the present invention, the general architecture and operation of a non-volatile memory system is described. The specific architecture and operation of the adaptive aspects of the present invention are then described with reference to the general architecture.

Example of a Non-Volatile Memory System

Figure 1A:
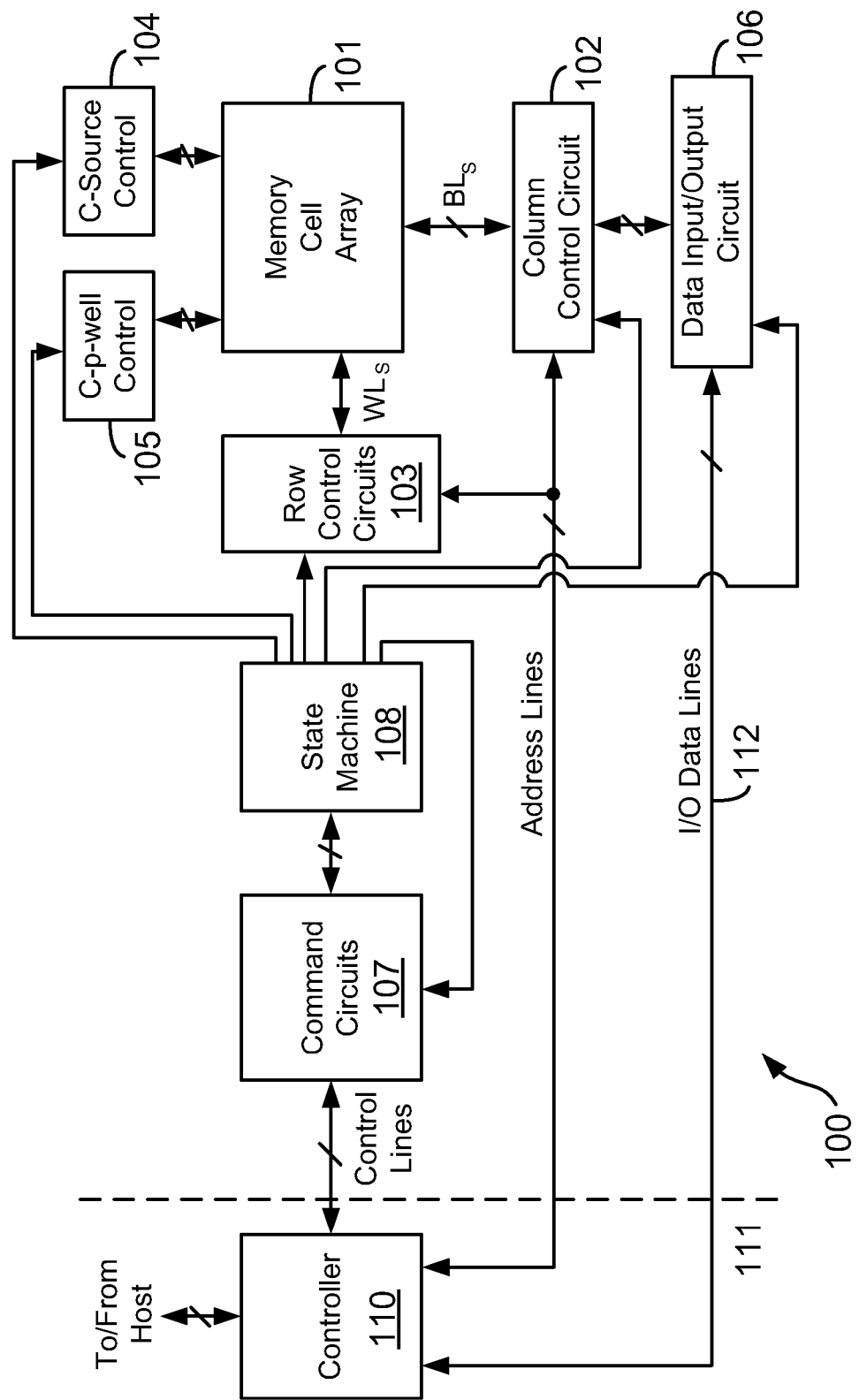
FIG. 1A is block diagram of a flash memory system of an embodiment.
Figure 1B:
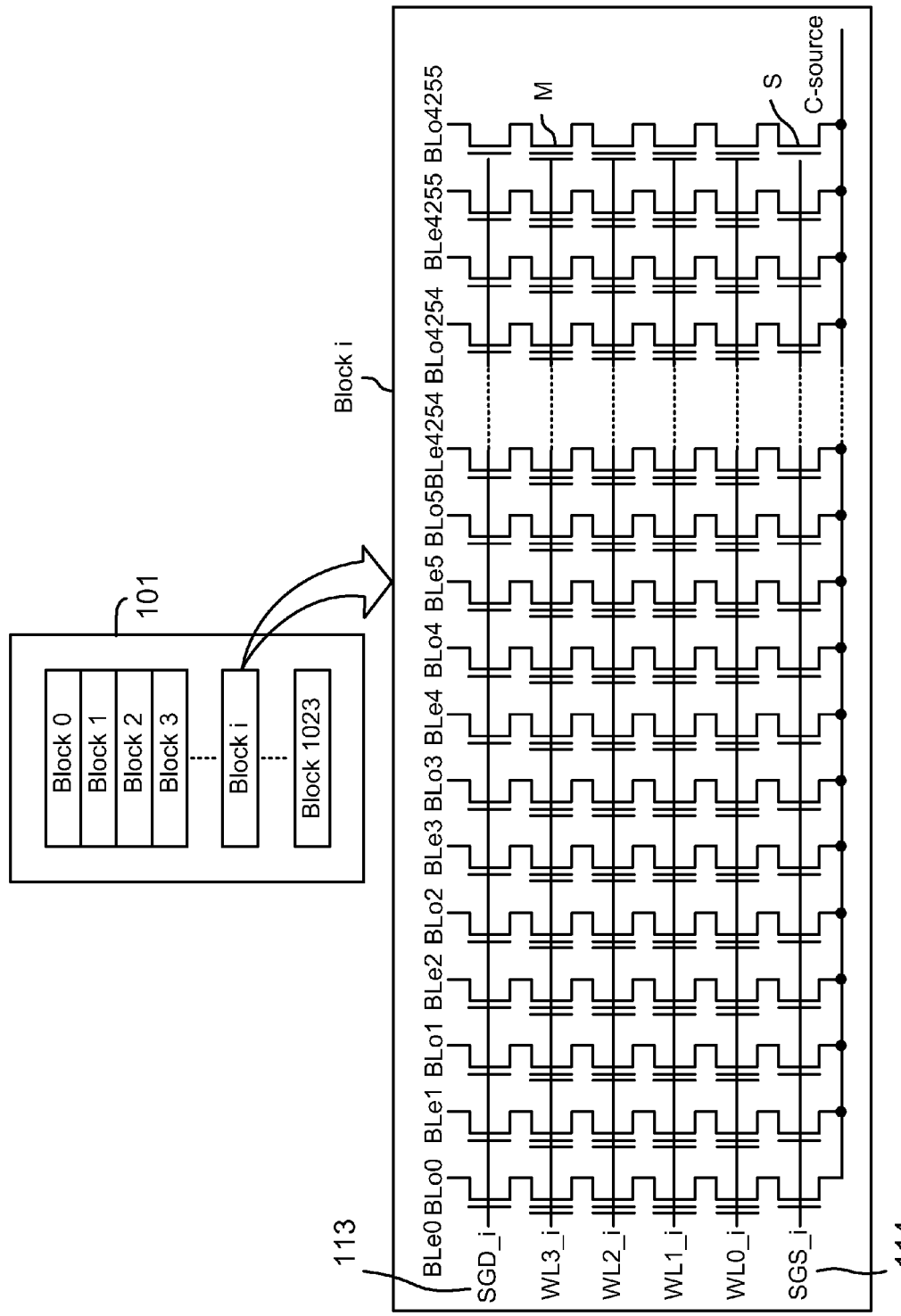
FIG. 1B shows an embodiment of a NAND string.

FIGS. 1A and 1B illustrate a non-volatile memory system 100 in which the various aspects of the present invention may be implemented. FIG. 1A represents a block diagram of non-volatile memory system 100, including a memory cell array 101. In one embodiment, memory cell array 101 includes a plurality of memory cells M arranged in a matrix, which is controlled by a column control circuit 102, a row control circuit 103, a C-source control circuit 104 and a C-p-well control circuit 105.

Column control circuit 102 is connected to bit lines BLs of memory cell array 101 for reading data stored in memory cells M, for determining a state of memory cells M during a program operation, and for controlling potential levels of bit lines BLs to promote the programming or to inhibit the programming of memory cells M.

Row control circuit 103 is connected to word lines WLs to select one of word lines WLs, to apply read voltages, to apply pro-ram voltages combined with the bit line potential levels controlled by column control circuit 102, and to apply an erase voltage coupled with a voltage of a p-type region on which the memory cells M are formed. The C-source control circuit 104 controls a common source line (labeled as "C-source" in FIG. 1B) connected to the memory cells M. The C-p-well control circuit 105 controls the C-p-well voltage.

Data stored in memory cells M are read out by column control circuit 102 and are output to external I/O lines via an I/O line and a data input/output circuit (or buffer) 106. The external I/O lines are connected to a controller 110.

Program data to be stored in memory cells M are input to data input/output circuit 106 via the external I/O lines and transferred to column control circuit 102. Command data for controlling flash memory system 100 are input to a command interface (or circuit) 107 via external control lines connected with controller 110. Command data informs non-volatile memory system 100 of the operation requested. An input command is transferred to a state machine 108 that controls column control circuit 102, row control circuit 103, c-source control circuit 104, C-p-well control circuit 105 and data input/output circuit 106. State machine 108 can output a status of non-volatile memory system 100, such as READY/BUSY or PASS/FAIL signals (or commands).

Controller 110 is connected or connectable with a host system such as a personal computer, a digital camera, or a personal digital assistant. The host system initiates commands, such as commands to store or read data to or from memory cell array 101, and to provide or receive such data. Controller 110 converts such commands into command signals that can be interpreted and executed by command circuits 107. Controller 110 also typically includes buffer memory (not shown) for user data written to or read from memory cell array 101.

A typical memory system includes one integrated circuit chip 111 that includes controller 110, and one or more integrated circuit chips 112 that each includes a memory array and associated control, input/output and state machine circuits. The memory array and controller circuits of a system may be integrated together on one or more integrated circuit chips.

The memory system may be embedded as part of a host system, or may be included in a memory card or other device that is removably insertable into a mating socket of host systems, or otherwise capable of connection with host systems. Such a card may include the entire memory system, or the controller and memory array, with associated peripheral circuits, may be provided in separate cards.

FIG. 1B illustrates an exemplary structure of memory cell array 101, which is a flash EEPROM of a NAND type device. In this example, memory cells M are partitioned into 1,024 blocks. The data stored in each block are simultaneously erased. The block is thus the minimum unit of a number of cells that are simultaneously erasable. In each block, in this example, there are 8,512 columns that are divided into even columns and odd columns. The bit lines are also divided into even bit lines BLe and odd bit lines BLo.

Four memory cells connected to the word lines WL0 to WL3 at each gate electrode are connected in series to form a NAND cell unit. One terminal of the NAND cell unit is connected to corresponding bit line BL via a first select transistor S whose gate electrode is coupled to a first select gate line SGD 113. Another terminal of the NAND cell unit is connected to a C-source via a second select transistor S whose gate electrode is coupled to a second select gate line SGS 114. Voltage $V_{SGD}$ is applied to first select gate line SGD 113. Although only four floating gate transistors are shown to be included in each cell unit, for simplicity a higher number of transistors, such as 8, 16 or even 32, are used.

In this example, during a user data read and programming operation, 4,256 memory cells M are simultaneously selected. The memory cells M selected have the same word line WL, for example WL2, and the same kind of bit line BL, for example, the even bit lines BLe0 to BLe4255. Therefore, 532 bytes of data can be read or programmed simultaneously.

The adaptive aspects of the present invention are not limited to the structure/system described above with respect to FIGS. 1A and 1B. For example, although, a NAND architecture of memory cell array 101 is described, other architectures, such as NOR, may be used to implement the adaptive aspects of the present invention. Further, the present invention may be used for dual state or multi-state memory cells, where a dual state memory cell stores 1 bit of data and a multi-state memory cell stores more than 1 bit of data.

Figure 1C:
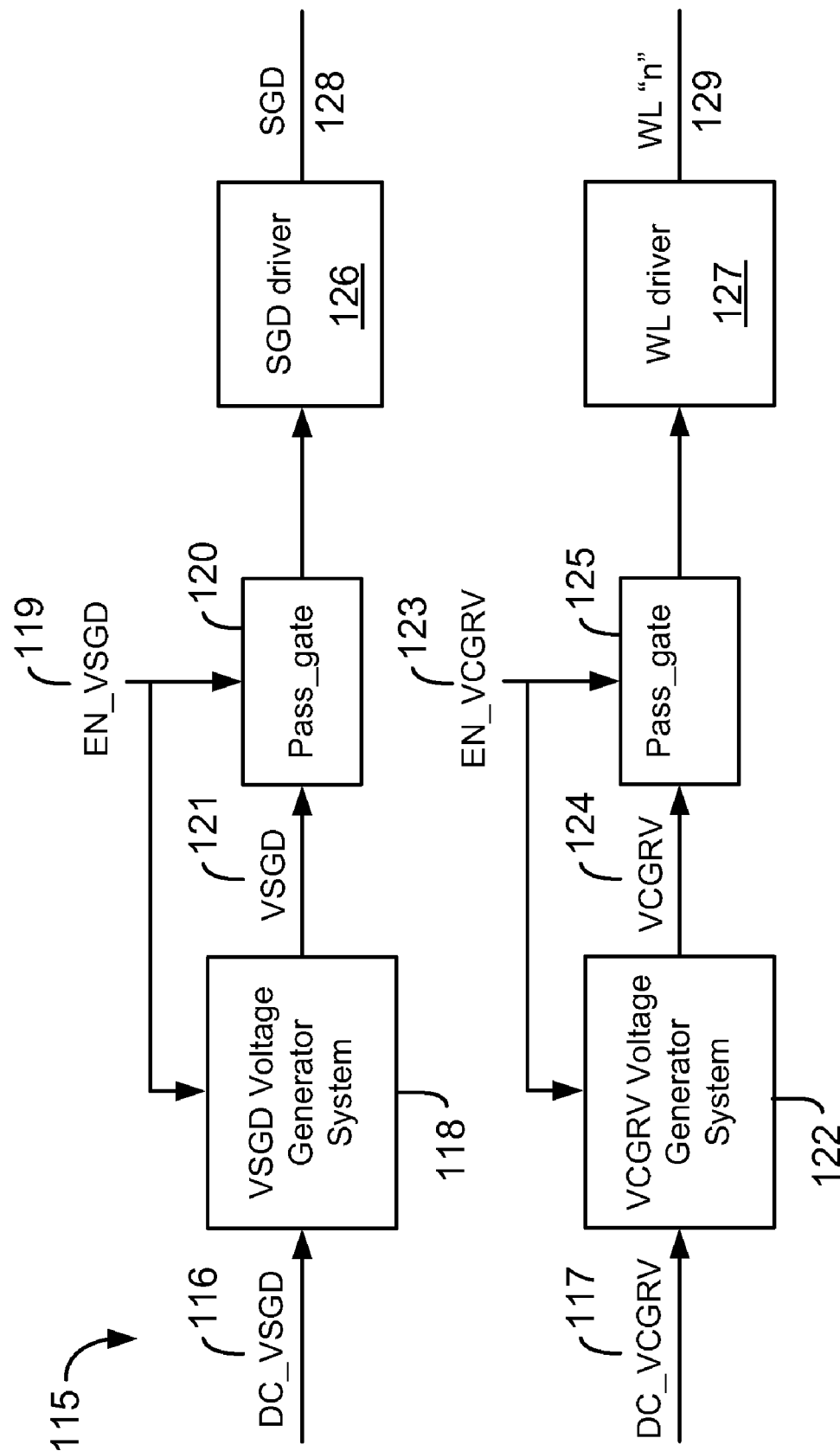
FIG. 1C is an illustration of a conventional architecture for a voltage generator system.

Typical Solution for Controlling $V_{SGD}/V_{CGRV}$:

FIG. 1C shows a conventional system 115 for controlling $V_{SGD}/V_{CGRV}$, which includes two separate voltage generator systems 118 and 122 to control the voltage and $T_{CO}$ for $V_{SGD}$ 121 and $V_{CGRV}$ 124, respectively. Voltage generator systems 118 and 122 are similar in structure and functionality.

$V_{SGD}$ voltage generator system 118 receives input 116 (provided by an on-board digital to analog (DAC) converter (not shown)) and generates $V_{SGD}$ 121. $V_{SGD}$ 121 is transmitted via pass-gate 120 and then amplified by SGD driver 126. Pass-gate 120 is enabled by signal 119, which is controlled by state machine 108 (FIG. 1A). Output 128 from SGD driver 126 is applied to first select gate line SGD 113 (FIG. 1B).

$V_{CGRV}$ voltage generator system 122 receives input signal 117 (from an on-board DAC) and generates $V_{CGRV}$ 124. WL driver 127 amplifies $V_{CGRV}$ 124 received via pass-gate 125. Signal 123 controlled by state machine 108 enables $V_{CGRV}$ voltage generator 122 and pass-gate 125. Output 129 from WL driver 127 is applied to an appropriate word line.

As shown in FIG. 1C, the conventional solution typically uses two voltage generator systems for controlling temperature dependent and temperature independent components of $V_{SGD}$ and $V_{CGRV}$. This increases cost and uses extra space on a flash memory device integrated circuit.

Figure 2A:
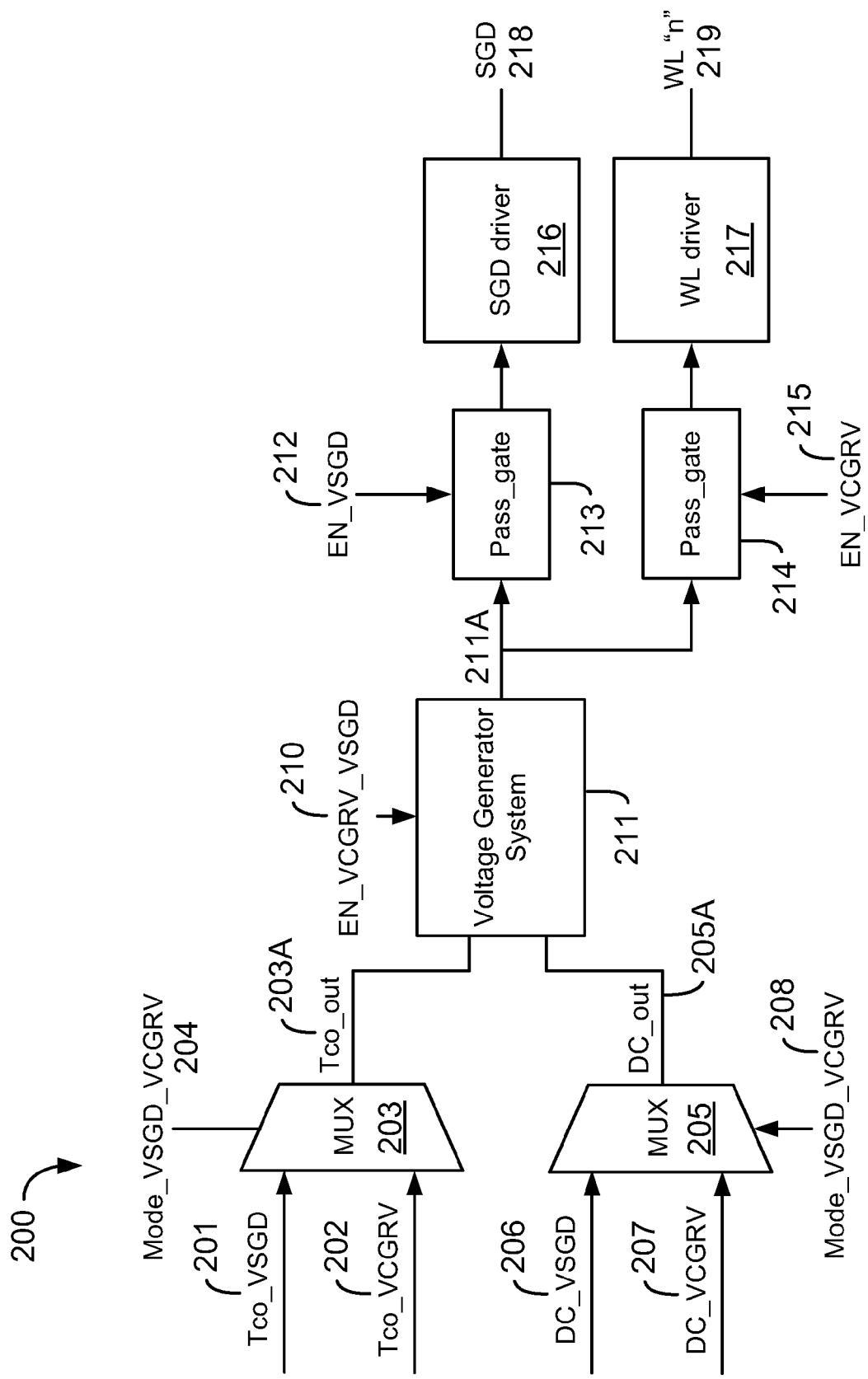
FIG. 2A is a block diagram of an embodiment of a system for independently controlling temperature dependent and temperature independent voltage components for plural operational modes.

Integrated Solution for Controlling Voltage and $T_{CO}$:

FIG. 2A shows system 200 for independently controlling temperature dependent and temperature independent components of voltage levels applied during plural operating modes, according to one aspect of the present invention. In one embodiment, the operating modes include a read and program-verify cycle when $V_{CGRV}$ is applied ($V_{CGRV}$ mode), a boosting phase of a program cycle when $V_{SGD}$ is applied ($V_{SGD}$ mode), or any other mode. System 200 uses time multiplexing to select input values that are used to independently control the temperature dependent and temperature independent components of the applied voltages.

In one embodiment, system 200 includes a multiplexer 203 ("MUX 203") that receives input temperature coefficient values, $T_{CO}\_V_{SGD}$ 201 and $T_{CO}\_V_{CGRV}$ 202 for the $V_{SGD}$ mode and $V_{CGRV}$ mode, respectively. $T_{CO}$ values 201 and 202 are optimum values that may be stored in memory cells during testing and verification of flash memory system 100 (FIG. 1A). MUX 203 selects one of the two input values (201 or 202) in response to signal 204 (or "command 204", used interchangeably throughout this specification). Signal 204 is controlled by state machine 108 and indicates whether a voltage is needed for the $V_{CGRV}$ or $V_{SGD}$ mode. Accordingly, MUX 203 generates an output 203A, the type of which depends on the operating mode indicated by signal 204. Output 203A becomes an input to voltage generator system 211 (also referred to as "voltage generator 211" or "system 211"). Output 203A, as described below, controls the temperature dependent component of $V_{CGRV}$ or $V_{SGD}$, depending on the operational mode.

Although FIG. 2A shows only two input values to MUX 203, the adaptive aspects of the present invention are not limited to two input values. Thus, MUX 203 may receive more than two input values.

System 200 also includes MUX 205, which receives input signals 206 and 207 from an onboard DAC (not shown). Signal 206 is an input for the $V_{SGD}$ mode and signal 207 is an input for the $V_{CGRV}$ mode. MUX 205 selects either signal 206 or 207 based on signal 208, which is controlled by state machine 108 (similar to signal 204). Signal 208 indicates whether voltage generator system 211 is to operate in the $V_{SGD}$ or $V_{CGRV}$ mode. MUX 205 generates an output signal 205A that is an input to voltage generator system 211. Output 205A, as described below, controls the temperature independent component of $V_{CGRV}$ or $V_{SGD}$, depending on the operational mode.

With respect to FIG. 2A, voltage generator system 211 independently controls $T_{CO}$ and voltage levels for both the $V_{CGRV}$ and $V_{SGD}$ mode (i.e. independently controls the temperature independent and temperature dependent components of $V_{CGRV}$ and $V_{SGD}$). Voltage generator system 211 operates in the $V_{CGRV}$ or $V_{SGD}$ mode in response to signal 210 generated by state machine 108.

Voltage generator system 211 generates output 211A for the $V_{SGD}$ or $V_{CGRV}$ mode. Output 211A is either sent to pass_gate 213 and SGD driver 216 (for the $V_{SGD}$ mode) or pass_gate 214 and WL driver 217 (for the $V_{CGRV}$ mode).

Pass_gate 213 is enabled by signal 212 for the $V_{SGD}$ mode, while pass_gate 214 is enabled by signal 215 for the $V_{CGRV}$ mode. Both signals 212 and 215 are controlled by state machine 108. Output 218 is sent to first select gate line SGD 113 (FIG. 1B), while output 219 is applied to the respective word line.

To save overall power, state machine 108 may turn off pass_gates 213 (in response to signal 212) and 214 (in response to signal 215), and voltage generator system 211 (in response to signal 210), when these components are not being used.

Figure 2B:
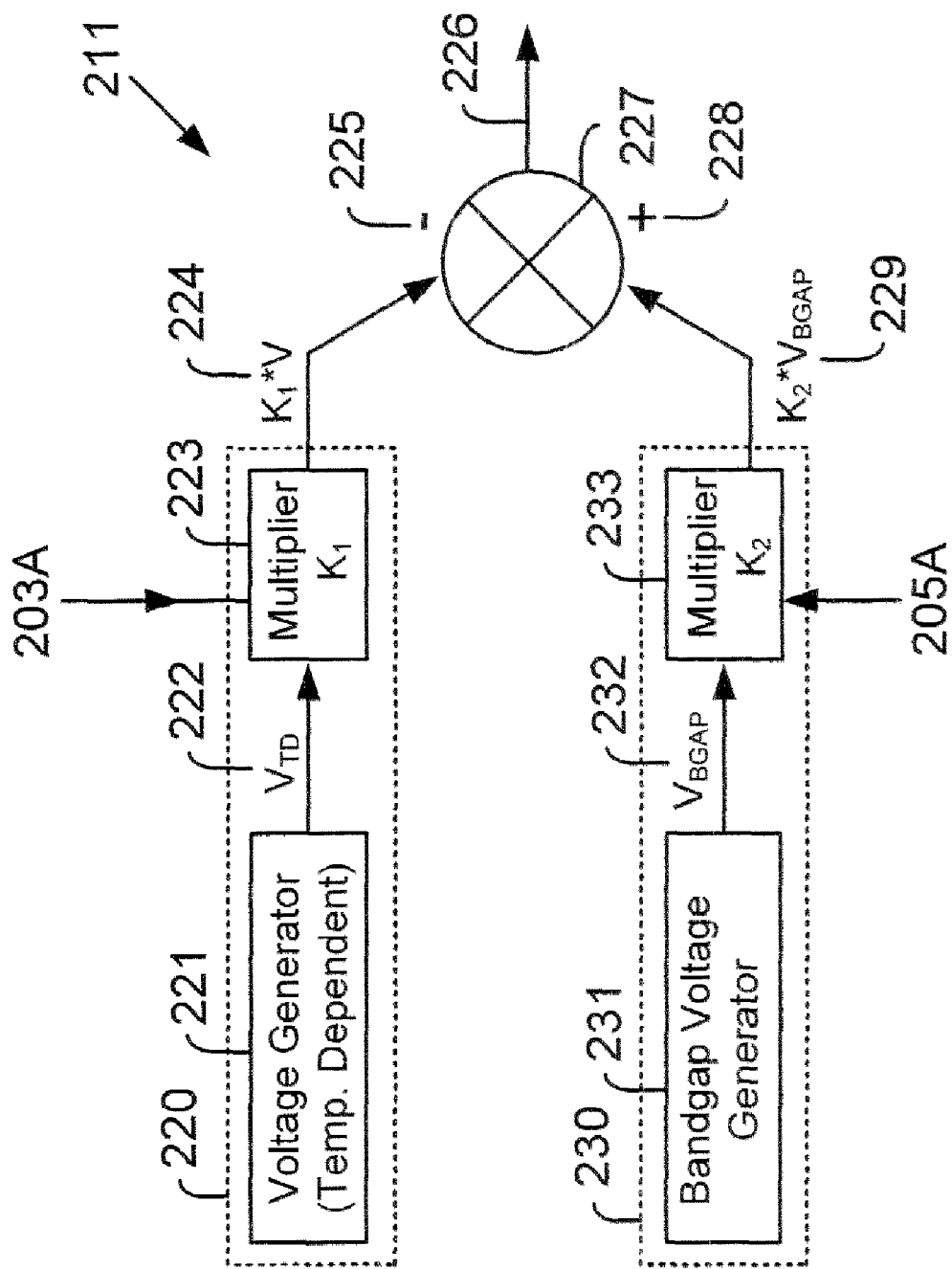
FIG. 2B is a block diagram of an embodiment of a voltage generator system used in the system of FIG. 2A.

FIG. 2B shows a block diagram showing components of voltage generator system 211 for independently controlling the temperature independent and temperature dependent components (i.e. voltage and $T_{CO}$) of voltage applied during plural operating modes, according to one aspect of the present invention. In one embodiment, system 211 includes a first module 220, a second module 230 and a "difference" amplifier 227 (also referred to as "amplifier 227").

First module 220 includes a voltage generator 221 for generating a temperature dependent reference voltage $V_{TD}$ 222. The value of reference voltage 222 depends on the operational mode of the flash memory system, such as whether the flash memory system is operating in the $V_{CGRV}$, $V_{SGD}$ or any other mode. Multiplier 223 multiplies reference voltage 222 by a multiplication factor, K1. Signal 203A received from MUX 203 varies K1 to control output 224. Output 224 (the temperature dependent component of the voltage) from first module 220 is input (shown as 225) to amplifier 227.

Second module 230 includes a band-gap voltage generator 231 that generates a temperature independent, band-gap reference voltage $V_{BGAP}$ 232. Multiplier 233 multiplies band-gap reference voltage 232 by a multiplication factor, K2. Signal 205A received from MUX 205 varies K2 to control output 229. Output 229 (the temperature independent component) is input (shown as 228) to amplifier 227.

As illustrated in FIG. 2B, first module 220 operates on voltage 222 to generate output 224 in response to signal 203A independent of how second module 230 operates on voltage 232 in response to signal 205A to generate output 229. Specifically, by varying K1 in response to signal 203A and K2 in response to signal 205A, voltage and $T_{CO}$ levels are controlled independently.

Amplifier 227 combines output 224, the temperature dependent component of the applied voltage and output 229, the temperature independent component of the applied voltage to generate output 226. Output 226 may be $V_{CGRV}$, $V_{SGD}$ or any other voltage type, depending on the operational mode of the system.

The following provides an example for independently controlling $V_{CGRV}$ and $T_{CO}$ (i.e. independently controlling the temperature independent and temperature dependent components) using system 211. $V_{CGRV}$ may be expressed by Equation (1) below:

$$V_{CGRV} = K_2 * V_{BGAP} - K_1 * V_{CGRVTD} \quad \text{Equation 1}$$

In Equation 1, K1 is the voltage multiplier for the temperature dependent component, K2 is a multiplier for the temperature independent component, $V_{BGAP}$ 232 is temperature independent band-gap reference voltage, and $V_{CGRVTD}$ ($V_{TD}$) 222 is the temperature dependent voltage.

$T_{CO}$ of $V_{CGRV}$ may be determined by Equation (2):

$$Tco = \frac{\delta V_{CGRV}}{\delta T} = K2 \frac{\delta V_{BGAP}}{\delta T} - K1 \frac{\delta V_{CGRVTD}}{\delta t}$$

$$Tco = \frac{\delta V_{CGRV}}{\delta T} = 0 - K1 \frac{\delta V_{CGRVTD}}{\delta T}$$

$$\frac{\delta V_{BGAP}}{\delta T} = 0 \, (\text{Because } V_{BGAP} \text{ is independent of temperature})$$

T is the absolute temperature

Equation (1) and Equation (2) show that one embodiment of the present invention provides independent control of voltage level and $T_{CO}$ for $V_{CGRV}$ 226. During flash memory device testing, optimum values for multipliers, $K_1$ and $K_2$ for plural operational modes may be stored in read only memory (not shown) or memory cells.

Figure 3:
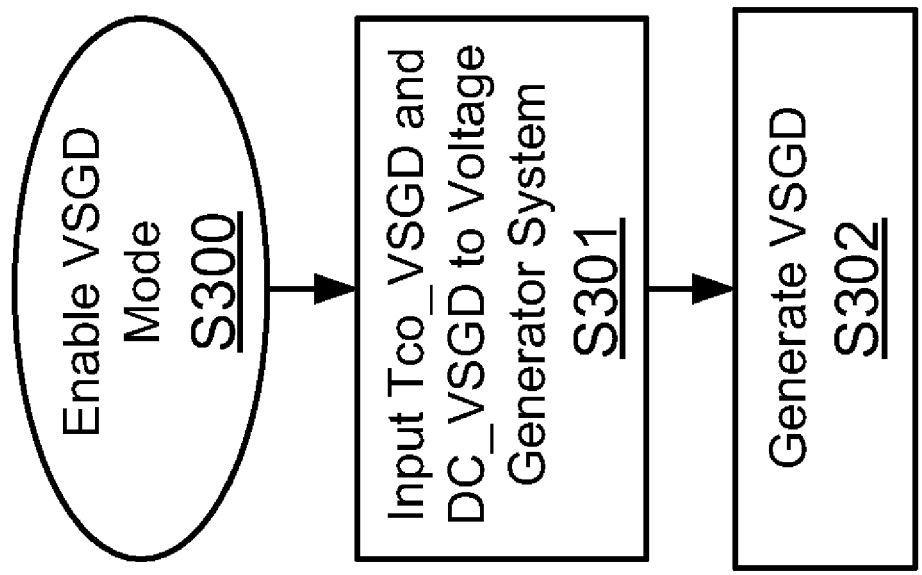
FIG. 3 is a flow diagram of an embodiment for controlling temperature dependent and temperature independent components of $V_{SGD}$.

Process Flow:

FIG. 3 shows a top-level process flow diagram for independently controlling the temperature independent and temperature dependent components of $V_{SGD}$, according to one aspect of the present invention. The process starts in step S300, when the $V_{SGD}$ mode is enabled. In one aspect, signals 204, 210 and 212 enable the $V_{SGD}$ mode.

In step S301, $T_{CO}\_V_{SGD}$ 201 and $DC\_V_{SGD}$ 206 are input to voltage generator system 211 that independently controls voltage and $T_{CO}$, as discussed above with respect to FIGS. 2A and 2B. In step S302, $V_{SGD}$ 226 is generated.

Figure 4:
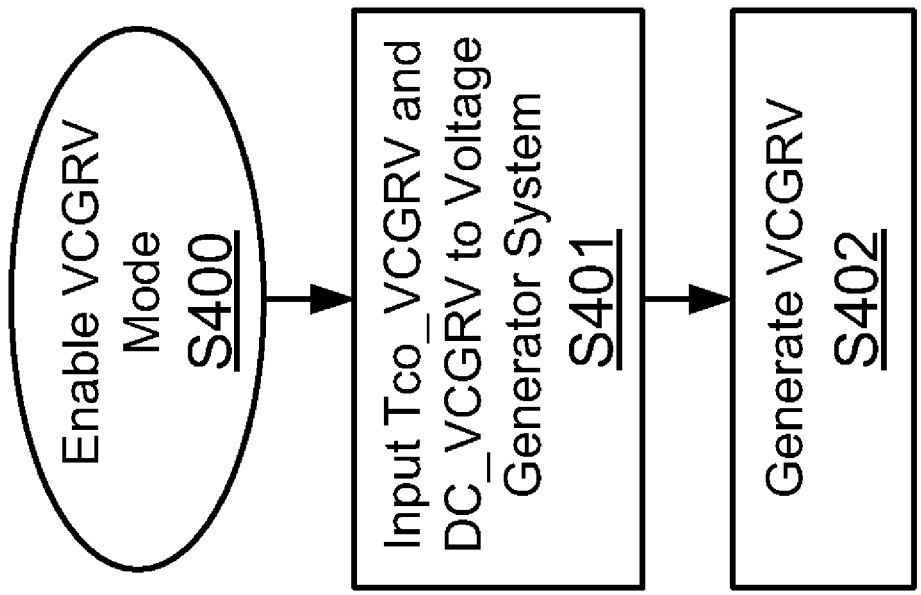
FIG. 4 is a flow diagram of an embodiment for controlling temperature dependent and temperature independent components of $V_{CGRV}$.

FIG. 4 shows a top-level process flow diagram for independently controlling the temperature independent and temperature dependent components of $V_{CGRV}$, according to one aspect of the present invention. The process starts in step S400, when the $V_{CGRV}$ mode is enabled. In one aspect, signals 208, 210 and 215 enable the $V_{CGRV}$ mode.

In step S401, $T_{CO}\_V_{CGRV}$ 202 and $DC\_V_{CGRV}$ 207 are input to voltage generator system 211 that independently controls voltage and $T_{CO}$, as discussed above with respect to FIGS. 2A and 2B. In step S402, $V_{CGRV}$ is generated.

While embodiments of the present invention are described above with respect to what is currently considered its preferred embodiments, it is to be understood that the invention is not limited to that described above. To the contrary, the invention is intended to cover various modifications and equivalent arrangements within the spirit and scope of the appended claims.

What is claimed is:

1. A method for controlling voltage in a non-volatile memory system, comprising:

selecting a first input value for a voltage generator system operating in one of a plurality of modes, the first input value controlling a temperature dependent component of a voltage applied to a memory cell; and selecting a second input value for the voltage generator system operating in one of the plurality of modes, the second input value controlling a temperature independent component of the voltage applied to the memory cell, wherein the temperature dependent component of the voltage applied to the memory cell and the temperature independent component of the voltage applied to the memory cell are controlled independently in response to the first input value and the second input value.

2. The method of claim 1, wherein a temperature dependent voltage generator generates the temperature dependent component of the voltage applied to the memory cell, a temperature independent voltage generator generates the temperature independent component of the voltage applied to the memory cell, and an amplifier receives an output of the temperature dependent voltage generator and an output of the temperature independent voltage generator and generates the voltage applied to the memory cell.

3. The method of claim 2, wherein the temperature independent voltage generator comprises a band-gap reference voltage generator.

4. The method of claim 1, wherein the plurality of modes comprises a read mode and a program verify mode.

5. The method of claim 1, wherein one of the plurality of modes comprises a select gate drain ($V_{SGD}$) mode.

6. The method of claim 1, further comprising using a signal controlled by a state machine to enable the voltage generator system to operate in one of the plurality of modes.

7. The method of claim 1, wherein the first input value comprises a temperature coefficient value that adjusts a first multiplier value to control the temperature dependent component of the voltage applied to the memory cell; and the second input value adjusts a second multiplier value to control the temperature independent component of the voltage applied to the memory cell.

8. The method of claim 1, wherein selecting the first input value for a voltage generator system and selecting the second input value for a voltage generator system comprises selecting the first input value and the second input value using a time multiplexing system.

* * * * *